US012622175B2

(12) United States Patent
Stadlober et al.

(10) Patent No.: US 12,622,175 B2
(45) Date of Patent: May 5, 2026

(54) PIEZOELECTRIC SENSOR WITH EMBEDDED ELECTRODES

(71) Applicant: JOANNEUM RESEARCH Forschungsgesellschaft mbH, Graz (AT)

(72) Inventors: Barbara Stadlober, Graz (AT); Martin Zirkl, Ludersdorf-Wilfersdorf (AT); Philipp Schaffner, Stattegg-Hochgreit (AT); Andreas Tschepp, Kumberg (AT)

(73) Assignee: JOANNEUM RESEARCH Forschungsgesellschaft mbH, Graz (AT)

( * ) Notice: Subject to any disclaimer, the term of this patent is extended or adjusted under 35 U.S.C. 154(b) by 1128 days.

(21) Appl. No.: 17/277,085

(22) PCT Filed: Oct. 10, 2018

(86) PCT No.: PCT/EP2018/077617
§ 371 (c)(1),
(2) Date: Mar. 17, 2021

(87) PCT Pub. No.: WO2020/074075
PCT Pub. Date: Apr. 16, 2020

(65) Prior Publication Data
US 2021/0408364 A1 Dec. 30, 2021

(51) Int. Cl.
*H01L 41/113* (2006.01)
*G01L 5/167* (2020.01)
(Continued)

(52) U.S. Cl.
CPC ........... *H10N 30/302* (2023.02); *G01L 5/167* (2013.01); *H10N 30/084* (2023.02); *H10N 30/87* (2023.02)

(58) Field of Classification Search
CPC .... H10N 30/084; H10N 30/87; H10N 30/302; G01L 5/167
(Continued)

(56) References Cited

U.S. PATENT DOCUMENTS 4,875,378 A 10/1989 Yamazaki et al.
8,362,675 B2 1/2013 Chen et al.
(Continued)

FOREIGN PATENT DOCUMENTS

CN 1307368 A 8/2001
CN 1813179 A 8/2006
(Continued)

OTHER PUBLICATIONS

Search Report from Indian Patent Application No. 202127009713, dated Nov. 9, 2022.
(Continued)

*Primary Examiner* — Emily P Pham
*Assistant Examiner* — Monica Mata
(74) *Attorney, Agent, or Firm* — Budzyn IP Law, LLC

(57) ABSTRACT

A piezoelectric sensor, comprising at least one first electrode, at least one second electrode, and a piezoelectric material, wherein the piezoelectric material has an anisotropic electromechanical coupling and the at least one first and second electrodes are at least in part embedded in the piezoelectric material, the piezoelectric material having a first surface wherein the electrodes extend vertically within the piezoelectric material from the first surface.

16 Claims, 6 Drawing Sheets

(51) Int. Cl.

| | |
|---|---|
| *H01L 41/047* | (2006.01) |
| *H01L 41/333* | (2013.01) |
| *H10N 30/084* | (2023.01) |
| *H10N 30/30* | (2023.01) |
| *H10N 30/87* | (2023.01) |

(58) Field of Classification Search

USPC ........................................................ 310/311

See application file for complete search history.

(56) References Cited

U.S. PATENT DOCUMENTS

| | | | |
|---|---|---|---|
| 2006/0132000 | A1 | 6/2006 | Katsuki et al. |
| 2010/0277040 | A1 | 11/2010 | Klee et al. |
| 2012/0055257 | A1 | 3/2012 | Shaw-Klein |
| 2012/0137787 | A1 | 6/2012 | Yao et al. |
| 2016/0247999 | A1 | 8/2016 | Aliane et al. |
| 2018/0069168 | A1 | 3/2018 | Ikeuchi et al. |
| 2018/0233651 | A1 | 8/2018 | Bang |
| 2019/0151898 | A1 | 5/2019 | Matsuda |
| 2020/0026897 | A1* | 1/2020 | Mainguet .......... G06V 40/1306 |

FOREIGN PATENT DOCUMENTS

| | | | |
|---|---|---|---|
| CN | 101786426 | A | 7/2010 |
| CN | 102736756 | A | 10/2012 |
| CN | 103493233 | A | 1/2014 |
| CN | 103918097 | A | 7/2014 |
| CN | 105313466 | A | 2/2016 |
| JP | S63204313 | A | 8/1988 |
| JP | WO2004/105148 | A1 | 7/2006 |
| JP | 2008/124448 | A | 5/2008 |
| JP | 2008172807 | A | 7/2008 |
| JP | 2010151630 | A | 7/2010 |
| JP | 2010/539442 | A | 12/2010 |
| JP | 2015/028425 | A | 2/2015 |
| JP | 2015201887 | A | 11/2015 |
| JP | 2016156825 | A | 9/2016 |
| JP | 2017188785 | A | 10/2017 |
| JP | WO2016175013 | A1 | 3/2018 |
| WO | 2017010135 | A1 | 1/2017 |

OTHER PUBLICATIONS

Office Action from Korean Application No. 1020217014019 dated Nov. 7, 2023.

Lee, Min-Seon, et al., Fabrication and energy harvesting characteristics of unimorph piezoelectric cantilever generators with interdigitated electrode lead zirconate titanate laminates., Japanese Journal of Applied Physics, 2017.

Ting, Yung, et al., Design and characterization of one-layer PVDF thin film for a 3D force sensor, Sensors and Actuators A: Physical, 250, Sep. 20, 2016.

Xu, Baomin, et al., Sensing characteristics of in-plane polarized lead zirconate titanate thin films, American Institute of Physics, Dec. 23, 1999.

Search Report from Chinese Patent Application No. 201880098556. 5, dated Feb. 28, 2023.

Huaixiang, Ma, et al., Engineering Test Technologies, Huazhong University of Science and Technology Press, pp. 114-118, Feb. 28, 2014.

International Search Report from PCT International Application No. PPCT/EP2018/077617, dated Jun. 19, 2019.

Search Report from Chinese Patent Application No. 201880098556. 5, dated Sep. 21, 2022.

Jinghua, Yin, An Introduction to Functional Materials, Harbin Institute of Technology Press, China, Aug. 2017.

\* cited by examiner

Figure 1
(Prior Art)
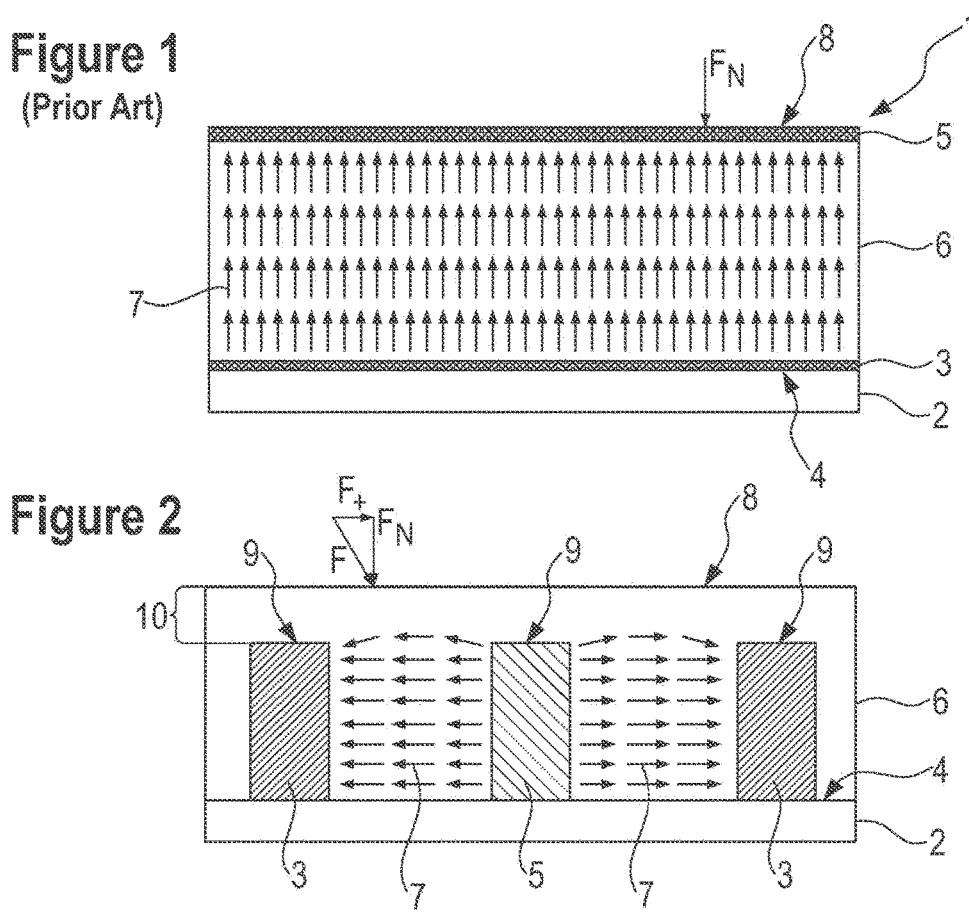
Figure 2
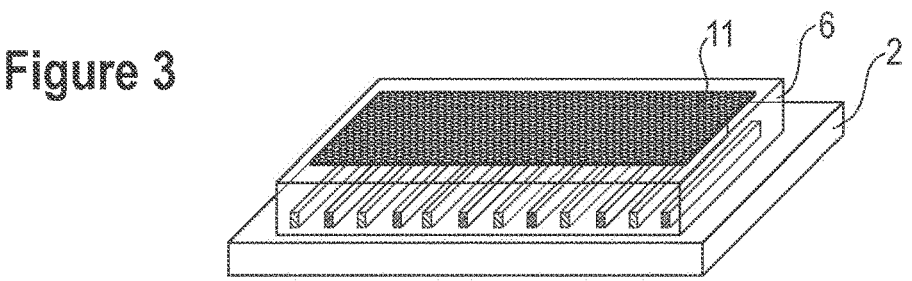
Figure 3
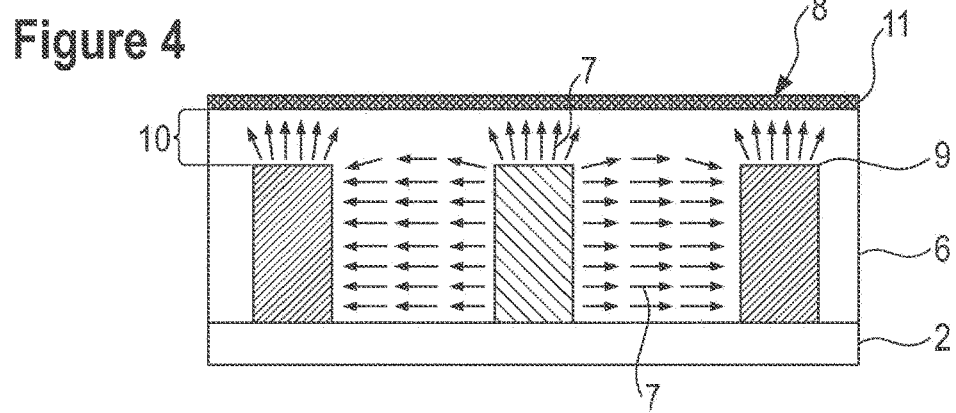
Figure 4

PIEZOELECTRIC SENSOR WITH EMBEDDED ELECTRODES

CROSS-REFERENCE TO RELATED APPLICATION

This Application is a National Stage Application under 35 U.S.C. § 371 of PCT Application No. PCT/EP2018/077617, filed Oct. 10, 2018, the entire contents of which are incorporated by reference herein.

FIELD OF THE INVENTION

The invention relates to a piezoelectric sensor.

BACKGROUND

Active sensors for the detection of forces are usually based on the piezoelectric effect. Active sensors are sensors that generate electrical energy during the measuring event rather than dissipating it. When a force is applied to a surface of the sensor, the mechanical stress is partly transformed into electrical energy which may be a qualitative and quantitative measure for the applied force. Piezoelectric sensors usually comprise a plurality of layers, wherein an active sensor material is embedded between a top-electrode-layer and a bottom-electrode-layer forming a vertical layer assembly. The active sensor material preferably consists of inorganic ceramics or electroactive polymers e.g. poly(vinylidenefluoride) (PVDF) and/or poly(vinylidenefluoride: trifluoroethylene)(P(VDF:TrFE)) or any combinations of them (e.g. nanocomposite materials). These polymer materials provide high mechanical flexibility and can be processed in industrial scale processing. In common active sensors, the sensor material is embodied as a sensor film. Mechanical stress applied on a surface of the sensor causes deformations of the sensor material which generates compensation charges in the electrodes. These charges can be transformed into a signal. In this common sensor layout, the amount of charges and hence the signal highly depend on the direction in which the mechanical stress is applied. The charges are the more, the more stress is applied in a direction normal to the sensor film (that means in a direction parallel to a spontaneous polarization of the sensor material). Lateral forces, tensions and torques acting in the plane of the film (parallel to a surface of the sensor film) only generate relatively low voltages and cannot be distinguished from the signals generated by forces having a normal component.

Several concepts have been developed to measure lateral forces with piezoelectric sensors. For example, the sensor material forming the sensor film has been reinforced with mechanical structures in order to generate normal components of a lateral force inside the sensor material. In another example, the sensor film has been formed by electrospinning, wherein the filaments are of piezoelectric material, whereby enhanced sensitivity of the sensor film is achieved. These concepts still do not provide satisfying solutions when it comes to the detection of tangential components of forces applied on the surface of the piezoelectric sensor, shear forces or torque occurring on the surface the sensor is attached to or embedded in.

The invention aims to provide a piezoelectric sensor with enhanced sensitivity to any forces contributing to lateral stress.

The solution is defined in the independent claims. Further expedient embodiments are defined in the sub-claims.

SUMMARY OF THE INVENTION

The invention provides for a piezoelectric sensor, comprising at least one first electrode, at least one second electrode, a piezoelectric material; wherein the piezoelectric material has an anisotropic electromechanical coupling and the at least one first and second electrodes are at least in part embedded in the piezoelectric material, the piezoelectric material having a first surface, wherein the electrodes extend substantially at a right angle within the piezoelectric material from the first surface.

The invention is based on the use of a piezoelectric material (PM) showing an anisotropic electromechanical coupling, wherein the anisotropy can be i) intrinsic, ii) introduced during processing or deposition or iii) by means of treatment after deposition. Electromechanical coupling in this context shall refer to the effect that stress or strain applied to the PM will cause an electrically measurable change in its polarization. The electromechanical coupling is usually highest in one direction, which will be referred to as primary orientation, than in the transverse directions. For piezoelectric or ferroelectric materials having a non-zero spontaneous polarization, the primary orientation shall be defined as the direction of the overall spontaneous polarization. Material examples are ferroelectrets, piezoelectric ceramics, fibers and polymers, ferroelectric materials, composite materials where at least one component is piezoelectric etc. Regarding case (iii), ferroelectric materials shall be explicitly mentioned as being suitable PMs, where the orientation of the ferroelectric domains can be altered by applying high external electric fields beyond the coercive field strength.

The electromechanical coupling of a piezoelectric material can be described by the following linear constitutive equations (using Einstein notation):

$$\varepsilon_{ij} = s_{ijkl}{}^{E}\sigma_{kl} + d_{kij}E_k \tag{1}$$

$$D_i = d_{ikl}\sigma_{kl} + \epsilon_{ik}{}^{\sigma}E_k. \tag{2}$$

Here, $\varepsilon_{ij}$ and $\sigma_{kl}$ denote the 2nd rank strain and stress tensor elements, respectively, $E_k$ and $D_i$ are the components of the electric field and dielectric displacement vectors, $s_{ijkl}{}^{E}$ are the elastic compliance constants for zero electric field condition contained in a 4th rank tensor, $\varepsilon_{ik}{}^{\sigma}$ denotes the elements of the permittivity tensor for absent stress and $d_{ikl}$ are the piezoelectric constants in the piezoelectric coupling tensor. These piezoelectric constants describe quantitatively how mechanical stress acting upon the piezoelectric material transforms into a change of the dielectric displacement, which gives rise to a changed surface charge density (piezoelectric effect). By applying electrodes onto the surface of the piezoelectric material a change in the surface charge density can be measured as a change in compensation charges, where the link between measured charge $Q_i$ on an electrode i and dielectric displacement is given in the equation:

$$Q_i = \int D \cdot da_i$$

The integral runs over the electrode surface that can be arbitrarily curved, where $da_i = da_i \cdot n$(surface normal vector n). Per definition, in the material frame the direction of primary orientation of the piezoelectric material is the z-direction (3-direction). For ferroelectric materials (FM) the polarization and therefore primary orientation of the bulk is switchable or can even be reoriented below a critical temperature (Curie temperature). Below, this process of reorientation will be referred to as poling.

For the claimed invention a piezoelectric material is chosen that has at least two non-equal components different from zero in the piezoelectric coupling tensor, where the highest piezoelectric coefficient is the one for stresses acting in the primary orientation of the material, i.e. the $d_{333}$ or $d_{33}$ (Voigt notation). Depending on the other piezoelectric coefficients $d_{3jk}$ (with $j,k \neq 3$), stresses applied in other directions than the primary one may also contribute to a change in the polarization and surface charge density. The ratio of the piezo coefficients is material specific and determines how strong the electromechanical coupling is direction dependent. To measure the coupling usually electrodes are applied to the PM. Mechanical stress in the PM will give rise to an electric current (short circuit condition), a potential drop (open-circuit condition) or both (load condition). For the sensor according to the invention, the sensor signal can be determined as the measurable electric current or voltage generated under mechanical activation.

A sensor according to the invention comprises first and second electrodes with alternating polarity which are embedded in the PM. Tension or stress in the PM will cause the PM to deform and generate charges on the first and second electrodes. If the stress acts in a lateral direction with respect to the first surface of the PM, that is, parallel to the primary orientation of the polarization and substantially perpendicular to the first and second electrodes extending from the first surface of the PM, the sensor signal will be maximal. Preferably the electrodes extend vertically, i.e. at an angle of 90 degrees, from the first surface. However, the present invention is not limited to angles of exactly 90 degrees and the electrodes may extend at other angles within a range of +/−10 degrees, for example, from a right angle. In other words, the sensitivity of the sensor is highest for lateral forces or stresses. Stresses acting perpendicular, i.e. in the direction normal to the first surface of the PM, however, will be detected with lower sensitivity due to the anisotropy of the PM. As to the sensitivity, it can be tuned by varying the cross profile, lateral geometry, aspect ratio height:width, and separation of the first and second electrodes as well as thickness and alignment of the PM. In case the PM is ferroelectric, a poling method using applied AC or DC voltages and frequencies as well as temperature, will further affect the sensitivity. Although the first and second electrodes are claimed as being embedded in the PM, the principle is also true for placement of the first and second electrodes below or on top of the PM, especially in case the PM possesses a laterally aligned primary orientation after deposition, that is, poling is not required after deposition. Examples for the last case are (polymer or inorganic) piezo fibers (e.g. ZnO nanowires) aligned with the primary orientation laterally and normal to the edges of the first and second electrodes. As a result, the primary orientation of the PM is substantially parallel to the first surface of the PM, the sensor is most sensitive to any forces contributing to high lateral stresses in the PM layer such as: a) the tangential component of forces applied on the surface of the PM either directly or via an intermediate layer; b) shear forces occurring on the surface the sensor is attached to or embedded in; c) torque acting at or upon the surface the sensor is attached to or embedded in; d) forces variable in time and space as originating from acoustic and sound waves (up to GHz) at the interface or in the region of the area the sensor is attached to or embedded in, especially surface acoustic and body waves. It directly follows that lateral strain in the PM layer also causes a sensor response making the piezoelectric sensor also useful as active strain sensor.

In another embodiment of the piezoelectric sensor the first and second electrodes are laterally interdigitated first and second electrode fingers forming an intermeshing comb structure within the piezoelectric material and the electrode fingers are individually electrically connectable. The higher the number of intermeshing electrode fingers, the higher is the sensitivity of the sensor.

In another embodiment of the piezoelectric sensor the first and the second electrode fingers are arranged in an angle $0 < \alpha < 90$ degrees in relation to one another. The sensor signal depends on the angle between the electrode fingers and direction of the lateral stresses in the plane of the PM. An interdigitating design can be chosen as one variant for the first and second electrodes. The first and second electrodes do not necessarily be aligned parallel. The area spanned by the first and second electrodes surrounded or coated with PM determines the spatial resolution of the sensor. The lateral shape and arrangement of the first and second electrodes relative to each other can be adjusted to the type of mechanical excitation that should be detected.

In another embodiment of the piezoelectric sensor the first and second electrodes form a star-shaped arrangement in relation to the first surface. A star-like geometry might be chosen to be especially sensitive to torque or radial symmetric deformation.

In another embodiment of the piezoelectric sensor the piezoelectric material is additionally pyroelectric. In case the PM is in addition pyroelectric, temperature changes in the material also contribute to a sensor signal and are therefore detectable. Such a temperature change could be caused by (partly) absorbed heat radiation, that is, electromagnetic waves in the range of mid to near infrared (MIR/NIR) irradiating onto the sensing area. As the first and second electrodes are laterally arranged and embedded in the PM, the first and second electrodes contribute to this effect by re-emitting or dissipating absorbed heat radiation yielding an increased temperature change compared to irradiation into the piezoelectric material alone.

In another embodiment of the piezoelectric sensor the first and second electrodes are disc-shaped or elliptical. This shape of the electrodes can increase absorption of heat radiation and can make the sensor suitable for heat and/or radiation detection. By using said shapes and/or a suitable material an increase in absorption comparable to a $\lambda/4$ wave absorber structure and/or employment of plasmonic effects is achieved.

In another embodiment of the piezoelectric sensor the sensor comprises a substrate, wherein the piezoelectric material forms a layer on the substrate and wherein the substrate is a flexible, elastic substrate, preferably a polymer foil such as PET. The PM is processed and applied onto the substrate such that the primary orientation of the PM points parallel to an interface between PM and substrate. The claimed sensor can be embedded into or attached onto a target body for measurement. In this case the substrate can be omitted. By virtue of the flexibility of the sensor, the sensor is attachable to surfaces having different shapes. The coupling of the mentioned forces into the PM is optimizable by choosing a suitable substrate material. The coupling is further steerable by varying thickness and bonding of the substrate to the PM layer, to the first and second electrodes and to a surface of the target body. The area spanned by the first and second electrodes surrounded or coated with PM determines the spatial resolution of the sensor.

In another embodiment of the invention, the sensor comprises a third electrode, wherein the third electrode is arranged at the first surface of the piezoelectric material or at a second surface opposite the first surface, and wherein the third electrode is spaced apart from the first and second electrodes. In this embodiment, a third electrode is combined with the sensor to form a multimodal sensor. The third electrode is added to the sensor comprising the first and second electrodes. Both the third electrode and the first and second electrodes can be connected separately. The third electrode is arranged on a top (first) or bottom (second) surface of the PM (or vice versa). In addition, there exists a layer in the region between the first and second electrodes (between a top side of the first and second electrodes and the third electrode; the layer is formed by the PM). By virtue of the third electrode, the sensor enables the detection of both normal forces acting upon an upper surface of the sensor and lateral forces (shear forces, torque) acting in the plane representative of the upper surface.

In another embodiment of the sensor, the third electrode is arranged between the piezoelectric material and the substrate. The third electrode can be arranged in the bottom interface between the PM and the substrate, provided there is a space between the first and second electrodes and the interface filled with PM.

In another embodiment of the invention a primary orientation of the polarization of the piezoelectric material between the third electrode and a top-side of the first and second electrodes is substantially parallel to a vertical extension of the first and second electrodes and substantially perpendicular to a plane representative of a lateral extension of the third electrode. Between the first and second electrodes (their top-sides) and the third electrode, the primary orientation of the PM is mainly aligned vertically. In the case of a FM filling the region between the third electrode and the top sides of the first and second electrodes as well as between the first and second electrodes, such a vertical alignment can be introduced by poling. Stresses acting normal on the third electrode will then cause measurable charge displacements between the third electrode and the top sides of the first and second electrodes. The charge displacements are representative of a quantity of a normal component of the acting force. The tangential components of the acting force are detectable through measurable charge displacements between the first and second electrodes.

In another embodiment of the invention, the sensor comprises low-power circuitry arranged for harvesting electrical energy generated by the piezoelectric material upon a deformation of the piezoelectric material by mechanical stress, and wherein the circuitry is arranged for signal processing using a wireless transmitter. The sensor is active in the way that it does not dissipate electrical energy during a measurement process but converts some of the mechanical energy and/or thermal energy invested during activation into electrical energy. This energy can be harvested to supply a low-power electronic circuit for signal processing and even a wireless transmitter. When sufficient energy is harvested, a signal transmission can be performed. Therefore, the sensor can form an essential building block in self-sustained sensor networks.

According to another aspect of the invention, there is provided a sensor array, comprising a plurality of sensors according to any combination of the aforementioned embodiments, wherein the sensors are rotated in respect to one another. Placing several, rotated sensors next to each other makes it possible to resolve the direction of stresses or shear forces as well as their quantity.

In another embodiment of the sensor array, the sensor array comprises a first and a second sub-array, each sub array comprises at least two sensors, wherein the two sensors of each sub-arrays are arranged to extend at an angle, in particular an angle of 45° degrees respect to one another. A displaced alignment of sensors to resolve the direction of lateral forces is thereby provided. By virtue of this arrangement, an acting force generates 4 different sensor signal levels. Due to the primary orientation of the polarization of the PM between the first and second electrodes, the signal level generated by a sensor depends on an angle between the acting force and the first and second electrodes. Independent from the direction of the force, an inclination, preferably by 45°, of at least one sensor per sub-array results in different relative signal levels, because the array provides that at an angle between at least on sensor per sub array is $0<\alpha<90$. By the different relative signal levels the force is qualitatively and quantitatively distinguishable.

According to another aspect of the invention, there is provided a method for manufacturing a piezoelectric sensor, the method comprising providing a plurality of first and second electrodes in a single layer, and disposing an active material over the first and second electrodes. A simple and industrially scalable process is provided, wherein the process steps can be carried out by a variety of manufacturing techniques known in the art. The single layer may be a surface of a substrate which may be coplanar with a surface of the active material.

In an embodiment of the method, providing the plurality of first and second electrodes in a single layer is performed by one of the following or any combination thereof: a printing process; a lithography process; microfluidic structuring. In particular the processes may be: inkjet printing, screen printing, aerosol jet printing; photo lithography, electron beam lithography or imprint lithography in combination with metal liftoff and/or electroforming to enhance electrode layer thickness; or a microfluidic structuring process, where a conductive ink spreads in preprocessed microfluidic channels driven by micro capillary forces.

In another embodiment, the method further comprises providing a substrate, disposing the active material onto the substrate, forming a piezoelectric polymer layer, imprinting channels into the piezoelectric polymer layer and/or depositing an electrode material in the channels to provide the plurality of first and second electrodes.

In another embodiment of the method, the electrode material is a conductive ink, preferably Ag or Cu or PEDOT: PSS, and wherein the conductive ink is driven into the channels by capillary forces. Using microfluidic structuring, creates a very simple to scale process with good results.

In another embodiment the method further comprises thermally/UV curing or photonic sintering the conductive ink. This results in better electrical conductivity and surface quality, i.e. durability.

In another embodiment of the method disposing the active material onto the substrate is performed by one of the following: spin casting; drop coating; bar coating; inkjet printing; screen printing; gravure printing, physical or chemical vapor deposition, atomic layer deposition. The PM is applied on a flexible, elastic substrate, whereby the thickness and elastic properties (Young modulus) are optimized for the type of mechanical excitation that should be detected. Suitable substrate material polymer foils are PET, Polyimide, PEN, PC etc., or textile, leather among others. In the case of a polymer or composite based PM, the application of the PM on the substrate can be realized by the above mentioned manufacturing processes.

In another embodiment of the method the channels have rectangular, trapezoidal or triangular profiles, defining a shape of the first and second electrodes, and the imprinting is performed by hot-embossing (T-NIL) or UV-NIL (in case the PM is UV curable), UV-imprinting, mold casting. Varying the shape of a profile of the electrodes can be used to create sensors arranged for the detection of particular forces in particular environments.

In another embodiment, the method further comprises treating the surface of the piezoelectric polymer layer after the imprinting. This improves wetting by a conductive ink and contributes to better adhesion between the PM and the electrode material, e.g. the cured conductive ink.

In another embodiment of the method the piezoelectric polymer layer has a thickness which is higher than the height of the electrodes. This crates the layer between a top surface of the first and second electrodes and a surface of the PM and spaces the first and second electrodes apart from a possible third electrode. The layer between the first and second electrodes and the third electrode is a prerequisite for the alignment of the polarization direction of the PM inside the layer to create sensitivity towards forces acting at least in part perpendicular to the plane representing the third electrode.

In another embodiment, the method further comprises poling, to align ferroelectric domains within the piezoelectric polymer layer. If a ferroelectric material (FM) is used, poling is required to introduce a desired alignment in the FM. If, for example, a FM fills the region between the first and second electrodes, such an alignment can be introduced by the following poling steps:

a) the first and second electrodes are connected to a high voltage source according to their polarity. The poling procedure is performed so that the ferroelectric domains will be aligned in a primary orientation substantially perpendicular to the vertical surfaces of the first and second electrodes.

b) The first and second electrodes of different polarity are both externally connected to the same electric potential (e.g. grounded), whereas the third electrode is connected to another potential. Again, the poling procedure is performed so that the region of ferroelectric domains between the first and second electrodes and third electrode gets mainly oriented vertically. The sequence of both steps depends on the geometry of the first and second electrodes, the mean vertical separation (the thickness of the layer) between first and second electrodes and third electrode as well as from the physical properties of the FM.

In another embodiment, the method further comprises forming a third electrode, wherein the third electrode is spaced apart from the first and second electrodes and wherein forming the third electrode comprises depositing a layer of electrode material at a surface of the piezoelectric polymer layer substantially perpendicular to the first and second electrodes. Thereby a multimodal sensor is created. For poling the PM between the first and second electrodes and the third electrode, the first and second electrodes of different polarity are both externally connected to the same electric potential (e.g. grounded), whereas the third electrode is connected to another potential. Again, the poling procedure is performed so that the region of ferroelectric domains between the first and second electrodes and third electrode gets mainly oriented vertically. This creates sensitivity towards normal forces.

In another embodiment of the method the active material is a piezoelectric material, wherein the piezoelectric material has an anisotropic electromechanical coupling, and the plurality of first and second electrodes are at least in part embedded in the piezoelectric material. In particular, the method further comprises forming the electrodes to extend substantially at a right angle within the piezoelectric material from a first surface of the piezoelectric material.

SHORT DESCRIPTION OF THE DRAWINGS

Exemplary embodiments of the invention are described in relation to the following drawings:

FIG. 1 illustrates a piezoelectric sensor from the prior art;

FIG. 2 illustrates a schematic structure of a piezoelectric sensor according to the invention;

FIG. 3 illustrates a schematic structure of a further embodiment of the piezoelectric sensor according to the invention;

FIG. 4 illustrates a schematic structure of the piezoelectric sensor according to FIG. 3;

DETAILED DESCRIPTION OF EXEMPLARY EMBODIMENTS

Figures 5, 6, 7:
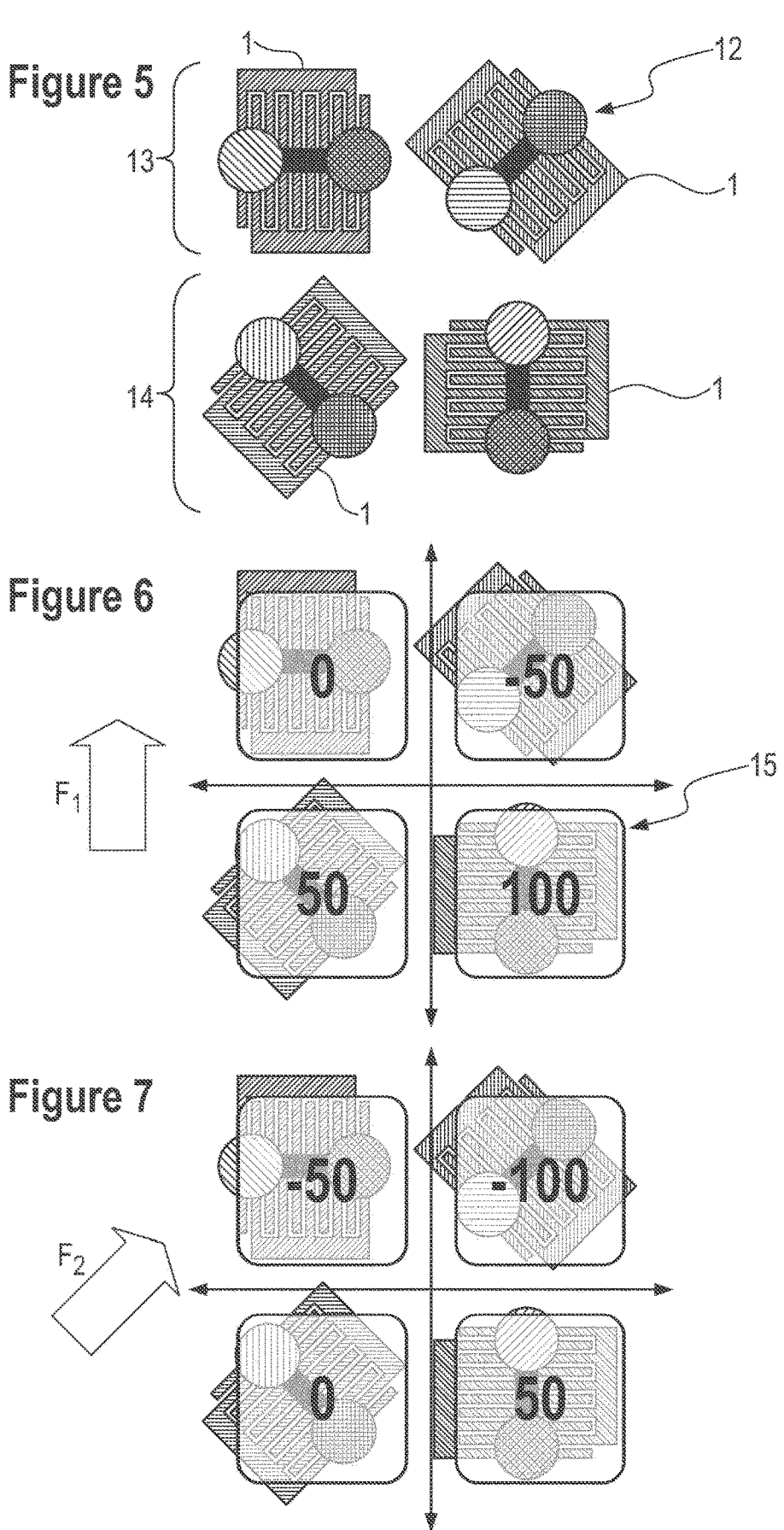
FIGS. 5 to 7 illustrate a schematic structure of a sensor array according to the invention.

FIG. 1 shows a piezoelectric sensor 1 from the prior art. The sensor 1 comprises a substrate 2. A first electrode, of a first electrical polarity, is disposed at a first (upper) surface 4 of the substrate 2. The sensor 1 further comprises a second electrode 5 of a second electrical polarity. The second electrode is arranged on top of a piezoelectric material 6, forming an active layer between the first electrode 4 and the second electrode 5. The piezoelectric material 6 has a primary orientation of the polarization 7 which is perpendicular in relation to a plane representative of the first electrode 3, the second electrode 5 and the substrate 2. If a force Fn acts upon an upper surface 8 of the sensor 1, the induced mechanical stress will result in a deformation of the piezoelectric material 6 and hence in a displacement of electrical charges in the piezoelectric material 6. A resulting voltage between the first electrode 3 and the second electrode 5 represents quantitative measure for the acting force Fn.

FIG. 2 shows a schematic structure of a piezoelectric sensor 1 according to the invention. The first and second electrodes are arranged on the substrate 2 and extend substantially at a right angle (vertically) from the upper surface 4 of the substrate 2 into the piezoelectric material 6. The first and second electrodes (3,5) have a substantially rectangular profile and are of alternating electrical polarity. The first and second electrodes form an interdigitating structure within the piezoelectric material 6. The first and second electrodes (3,5) are embedded in the piezoelectric material 6 and arranged substantially parallel in respect to one another. The first and second electrodes (3,5) are spaced apart from the upper surface of the sensor 8. Between a top side 9 of the first and second electrodes (3,5) a layer 10 of piezoelectric material 6 is formed, covering the top sides 9 of the first and second electrodes (3,5). The piezoelectric material 6 has an anisotropic electromechanical coupling. Stress applied upon the piezoelectric material 6 will cause an electrically measurable change in its polarization. Force F comprises normal component Fn and tangential component Ft. The component of F which is substantially parallel to a primary orientation of the polarization 7 of the piezoelectric material 6 between the first and second electrodes (3,5) will cause the major share in the electrically measureable displacement of electrical charges in the piezoelectric material 6. Ft is the component of F acting parallel to the primary orientation of the polarization 7 and hence causing the major share in the measurable shift of polarization in the piezoelectric material 6 between the first and second electrodes (3,5).

FIG. 3 shows a schematic structure of a further embodiment of the piezoelectric sensor according to FIG. 2. A third electrode 11 is arranged on the piezoelectric material layer 6, forming a top electrode. A footprint of the third electrode 11 covers at least parts of each one of the first and second electrodes (3,5).

FIG. 4 shows a schematic cross-section of the piezoelectric sensor 1 according to FIG. 3. The third electrode 11 covers the piezoelectric material 6 forming the upper surface 8 of the sensor 1. The third electrode is spaced apart from the top sides 9 of the first and second electrodes (3,5) by the layer 10. In addition to the polarization of the piezoelectric material 6 between the electrodes (3,5) (parallel to the third electrode 11 and substantially perpendicular to the electrodes (3,5)), the piezoelectric material 6 forming the layer 10 above the top sides of the first and second electrodes (3,5) has a primary orientation of the polarization 7 which is substantially parallel to the first and second electrodes (3,5) and substantially perpendicular to the third electrode 11.

FIGS. 5 to 7 show a sensor array 12 according to the invention. The sensor array 12 comprises a plurality of sensors 1 of the same kind. The first and second electrodes of each of the respective sensor are carried out as intermeshing comb structures. Each sensor 1 of the plurality of sensors 1 has a primary orientation of the polarization 7 between the first and second electrodes (3,5). Each sensor is arranged to detect tangential forces in the same direction as its primary orientation of polarization. In order to generate both a quantitative and a qualitative measure of an acting force, the sensors are rotated in respect to each other. The plurality of sensors is subdivided into a first sub-array 13 and a second sub-array 14. Each sub array comprises at least two sensors 1. Each sensor 1 represents a quadrant of a plane in which a tangential or shear force acts. If a force F1, as in FIG. 6, is applied parallel to an axis of a virtual coordinate system 15, those sensors having first and second electrodes (3,5) which are not parallel to the direction of the force F1, will generate a measurable signal. Thereby, sensors 1 will generate different signal levels according to their rotation relative to the acting force F1. In FIG. 7, the force F2 acts in a 45° degree angel in relation to the coordinate system 15. The sensor 1 whose first and second electrodes are perpendicular to the direction of F2 will generate the highest signal level. The sensor 1 whose first and second electrodes (3,5) are parallel to the direction of F2 will generate no (or the smallest) signal. The sensors 1 whose first and second electrodes (3,5) are rotated by 45° degrees in relation to the direction of F2 will each generate the same signal level but with different signs.

Figure 8A:
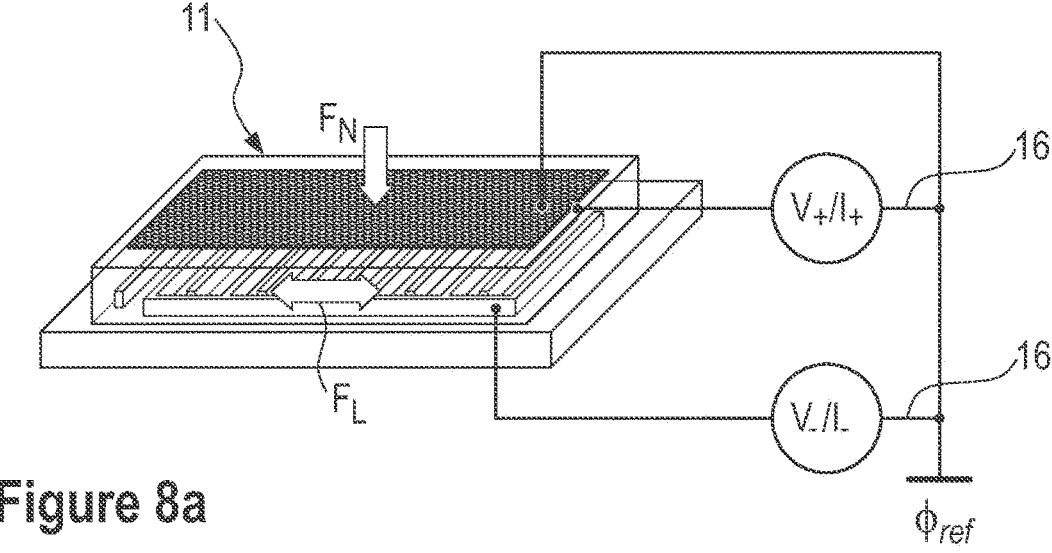
FIGS. 8a and 8b illustrate the piezoelectric sensor of FIG. 3 in an operating state.
Figure 8B:
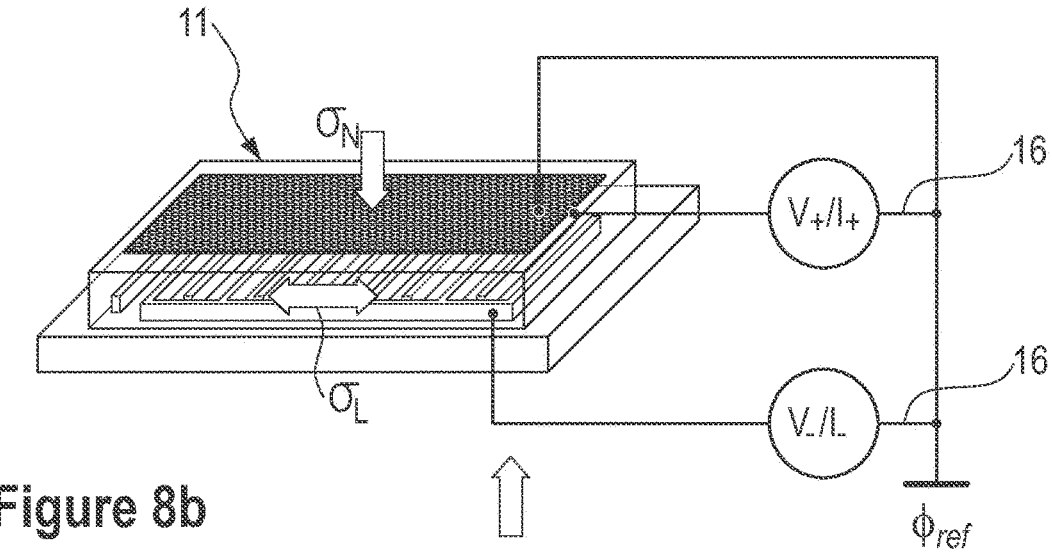

FIGS. 8a and 8b show the piezoelectric sensor 1 of FIG. 3 in an operating state. An electric connection 16 of the first and second electrodes (3,5) as well as the third electrode 11 as shown in FIG. 3 is employed to distinguish between lateral and normal force (FIG. 8a) or stress (FIG. 8b) components. As shown, the third electrode 11 is connected to a reference potential φref and either the potential differences V+, V− or currents I+, I− are measured between reference potential and the first and second electrodes (3,5) of different polarity. The sum signal is proportional to the normal force or stress acting upon the sensor, whereas the difference signal will correspond to the lateral force or stress contributions.

Figure 9A:
FIGS. 9a to 9e illustrate process steps in an exemplary manufacturing process for a piezoelectric sensor according to the invention.
Figure 9B:
Figure 9C:
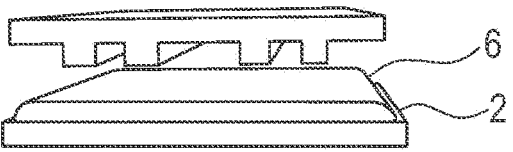
Figure 9D:
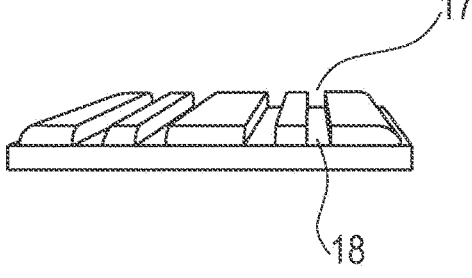
Figure 9E:
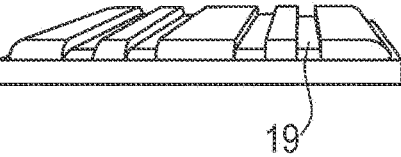

FIGS. 9a to 9e illustrate process steps in an exemplary manufacturing process of a piezoelectric sensor 1 according to the invention. In FIG. 9a a substrate 2 is provided. In FIG. 9b a polymer piezoelectric material 6 is applied onto the substrate 2 by a printing process to form a layer with a thickness significantly higher than the height of the first and second electrodes (3,5). In FIG. 9c microfluidic channels 17 with rectangular, trapezoidal or triangular profile 18 defining the shape of the first and second electrodes (3,5) are imprinted into the piezoelectric material 6 by means of hot embossing (e.g. T-NIL). The result—the channels—are shown in FIG. 9d. In FIG. 9e, upon optional surface treatment, a conductive ink 19 (e.g. Ag or Cu) is deposited and driven into the microfluidic channels 17 by capillary forces and thermally cured.

Figure 10:
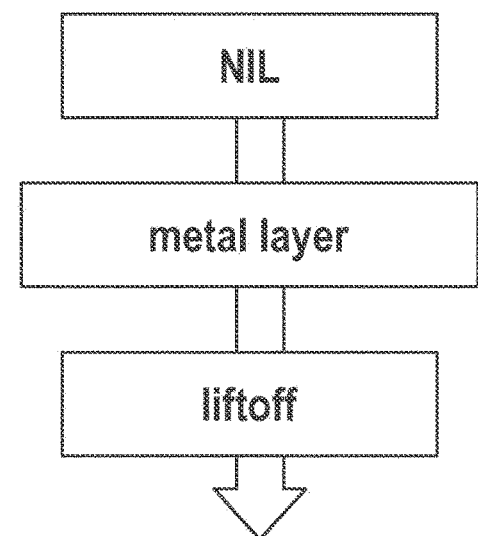
FIG. 10 illustrates a flow diagram of an imprinting process according to an aspect of the invention.

FIG. 10 shows a flow diagram of an exemplary nanoimprint lithography process (NIL) for manufacturing the piezoelectric sensor 1. A UV curable resin is applied onto the substrate 2 and imprinted residual free with a stamp containing the electrode structures and cured. A metal layer is deposited on top of the resin. The resin is removed lifting off the metal layer on top of the resin. Only metal in the imprinted area remains on the substrate 2. The transferred metal layer can be enhanced by electro deposition of the same or another metal, where the prestructured metal layer serves as a cathode during electroforming.

Figure 11:
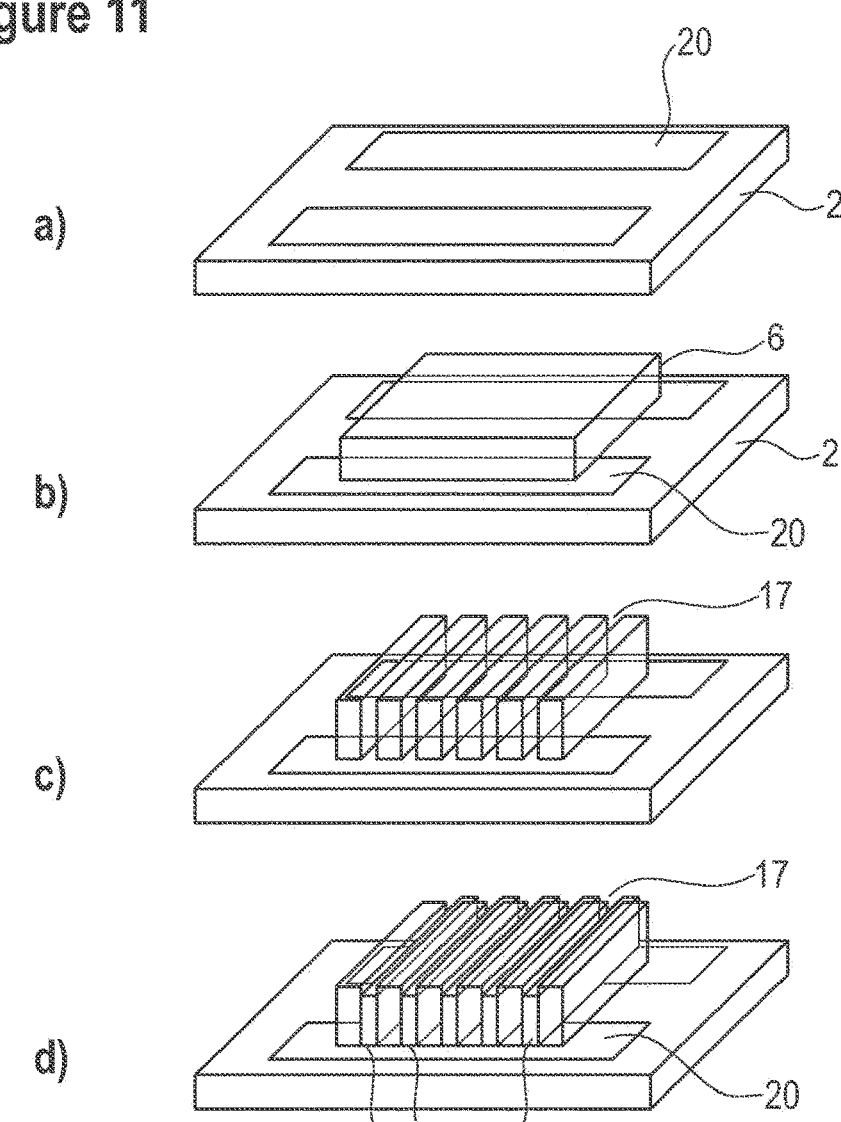
FIG. 11 illustrates another exemplary sequence of process steps in an exemplary manufacturing process for a piezoelectric sensor according to the invention.

FIG. 11 shows another exemplary sequence of process steps in another exemplary manufacturing process for a piezoelectric sensor 1 according to the invention. The process involves:

a) Deposition of conductive feed lines 20 to connect the first and second electrodes (3,5), e.g. by gravure or screen printing (possible on R2R). The substrate 2 is a foil with high thermal stability (up to 180° C.), e.g. polyimide.

b) P(VDF:TrFE) paste as piezoelectric material 6 is applied with an overlay between the feed lines 20.

c) Microfluidic channels 17 are hot embossed into the piezoelectric material 6 according to the scheme depicted in FIGS. 9a-9e.

d) Upon optional surface treatment, e.g. with ozone for a few minutes, the conductive ink 19, e.g. Ag nanoparticles in solution, is deposited into the channels 17 via reservoirs provided on an imprint design. Thereby further channels (not shown) are provided allowing the conductive ink 19 to flow outwards to get in contact with the feed lines 20. Afterwards the conductive ink 19 is sintered at elevated temperature creating conductive first and second electrodes (3,5) embedded in the piezoelectric material 6. Optionally, the first and second electrodes (3,5) can be enhanced by electro deposition of the same or other metal. Applying this process, 7 μm deep and 8.8 μm wide channels are formed in P(VDF: TrFE)=70:30% mol after screen printing on polyimide foil as substrate 2. An Ag nanoparticle conductive ink 19 is dropped into the reservoir and subsequently transported into the channels 17 via micro capillary forces and cured at 150° C. The Ag nanoparticle conductive ink forms a layer that covers both bottom and sidewalls of the channels 17 with a thickness range of 0.2 to 1.3 μm.

Figure 12:
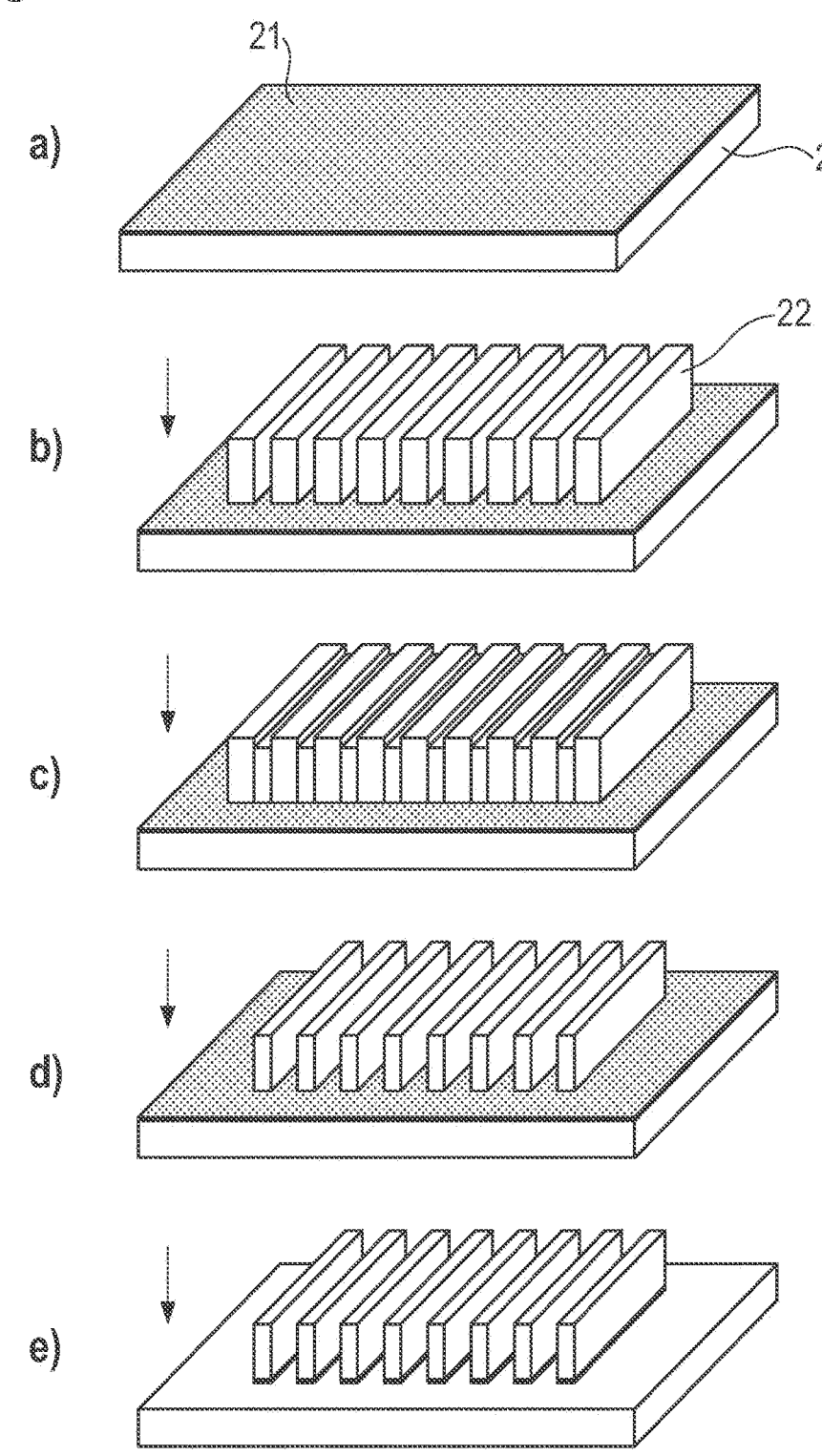
FIG. 12 illustrates another exemplary sequence of process steps in an exemplary manufacturing process for a piezoelectric sensor according to the invention.

FIG. 12 illustrates another exemplary sequence of process steps in an exemplary process for structuring the first and second electrodes (3,5) of the piezoelectric sensor 1. The first and second electrodes (3,5) are structured by means of photolithography and electroforming. The process is as follows:

a) The substrate 2 is coated with a conductive, metallic layer 21 serving later as seed layer 21 for electroforming (e.g. using a nickel sulfamate bath on a Ni or Cu seed layer).

b) A resist 22 is photolithographically structured to serve as a guiding layer 22.

c) The sample is put into a suitable electrolyte bath and the seed layer 21 is electrically connected such that metal is galvanically deposited in the area uncovered by the resist 22.

d) The resist 22 is chemically removed.

e) The seed layer is treated by wet or dry etching where no metal has been electroformed. In a further step (not shown) the P(VDF:TrFE) is applied onto the first and second electrodes (3,5) by means of spin casting or screen printing in order to embed the electrodes (3,5) in the piezoelectric material 6.

The invention claimed is:

1. A piezoelectric sensor (1), comprising:
at least one first electrode (3) having transversely-disposed first and second surfaces;
at least one second electrode (5) having transversely-disposed third and fourth surfaces;
a piezoelectric material (6); wherein
the piezoelectric material (6) has an anisotropic electromechanical coupling, and
the at least one first and second electrodes (3,5) are at least in part embedded in the piezoelectric material (6) so that the first and second surfaces of the at least one first electrode (3) and the third and fourth surfaces of the at least one second electrode (5) are in contact with the piezoelectric material (6), the piezoelectric material (6) having a first surface (4), wherein the at least one first and second electrodes (3,5) extend substantially at a right angle within the piezoelectric material (6) from the first surface (4).

2. The piezoelectric sensor (1) of claim 1, wherein the at least one first and second electrodes (3,5) are laterally interdigitated first and second electrode fingers forming an intermeshing comb structure within the piezoelectric material (6) with the first and second electrode fingers being individually electrically connectable.

3. The piezoelectric sensor (1) of claim 2, wherein the first and second electrode fingers (3,5) are arranged in an angle $0 < \alpha < 90$ degrees in relation to one another.

4. The piezoelectric sensor (1) of claim 1, wherein the piezoelectric material (6) is additionally pyroelectric.

5. The piezoelectric sensor (1) of claim 1, wherein the sensor (1) comprises a substrate (2), wherein the piezoelectric material (6) forms a layer on the substrate (2).

6. The piezoelectric sensor (1) of claim 1, wherein the sensor (1) comprises a third electrode (11) spaced apart from the at least one first and second electrodes (3,5).

7. The piezoelectric sensor (1) of claim 1, wherein the sensor (1) comprises a substrate (2), wherein the piezoelectric material (6) forms a layer on the substrate (2) and wherein a third electrode (11) is arranged between the piezoelectric material (6) and the substrate (2).

8. The piezoelectric sensor (1) of claim 6, wherein a primary orientation of the polarization (7) of the piezoelectric material (6) between the third electrode (11) and a top-side (9) of the at least one first and second electrodes (3,5) is substantially parallel to a vertical extension of the at least one first and second electrodes (3,5) and substantially perpendicular to a plane representative of a lateral extension of the third electrode (11).

9. A sensor array (12), comprising a plurality of sensors (1) according to claim 1,
wherein the plurality of sensors (1) are rotated in respect to one another.

10. The sensor array (12) of claim 9, wherein the sensor array (12) comprises a first and a second sub-array (13,14), each sub-array (13,14) comprising at least two of the plurality of sensors (1), wherein the at least two of the plurality of sensors (1) of each sub-array (13,14) are arranged non-parallel in respect to one another.

11. The piezoelectric sensor (1) of claim 5, wherein the substrate (2) is a flexible, elastic substrate (2).

12. The piezoelectric sensor (1) of claim 11, wherein the substrate (2) is a polymer foil.

13. The piezoelectric sensor (1) of claim 12, wherein the polymer foil is polyethylene terephthalate (PET).

14. The piezoelectric sensor (1) of claim 6, wherein the third electrode (11) is arranged at the first surface (4) of the piezoelectric material (6).

15. The piezoelectric sensor (1) of claim 6, wherein the third electrode (11) is arranged at a second surface opposite the first surface (4).

16. The sensor array of claim 10, wherein the at least two of the plurality of sensors (1) of each sub-array (13, 14) are arranged at an angle of 45° degrees in respect to one another.

* * * * *